US012772907B2

(12) United States Patent
Shin et al.

(10) Patent No.: US 12,772,907 B2
(45) Date of Patent: Oct. 20, 2026

(54) SEMICONDUCTOR PACKAGE

(71) Applicant: SAMSUNG ELECTRONICS CO., LTD., Suwon-si (KR)

(72) Inventors: Sangho Shin, Suwon-si (KR); Young Lyong Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 275 days.

(21) Appl. No.: 18/417,004

(22) Filed: Jan. 19, 2024

(65) Prior Publication Data

US 2024/0429202 A1 Dec. 26, 2024

(30) Foreign Application Priority Data

Jun. 20, 2023 (KR) ........................ 10-2023-0079058

(51) Int. Cl.
*H10W 90/00* (2026.01)
*H10W 74/00* (2026.01)
*H10W 74/10* (2026.01)

(52) U.S. Cl.
CPC .......... *H10W 90/00* (2026.01); *H10W 74/117* (2026.01); *H10W 90/701* (2026.01); *H10W 74/00* (2026.01); *H10W 90/723* (2026.01); *H10W 90/724* (2026.01); *H10W 90/792* (2026.01); *H10W 90/794* (2026.01)

(58) Field of Classification Search
CPC ... H10W 90/722; H10W 70/60; H10W 70/65; H10W 72/07236; H10W 72/012; H10W 72/20; H10W 72/222; H10W 72/223; H10W 72/234; H10W 72/245; H10W 72/252; H10W 72/255
See application file for complete search history.

(56) References Cited

U.S. PATENT DOCUMENTS

| | | | | |
|---|---|---|---|---|
| 6,259,159 | B1 | 7/2001 | Dalal et al. | |
| 8,580,621 | B2 | 11/2013 | Bachman et al. | |
| 9,190,377 | B2 | 11/2015 | Chen et al. | |
| 9,455,183 | B2 | 9/2016 | Hsiao et al. | |
| 10,049,970 | B2 | 8/2018 | Liu | |
| 11,257,775 | B2 | 2/2022 | Chen et al. | |
| 2007/0267745 | A1 | 11/2007 | Chao et al. | |
| 2014/0264843 | A1* | 9/2014 | Lin | H10W 74/47 257/737 |
| 2014/0346672 | A1* | 11/2014 | Lin | H10D 64/00 257/737 |
| 2016/0260677 | A1* | 9/2016 | Hsiao | B23K 35/262 |
| 2019/0393186 | A1* | 12/2019 | Wu | H10W 90/00 |

* cited by examiner

*Primary Examiner* — Fazli Erdem
(74) *Attorney, Agent, or Firm* — Morgan, Lewis & Bockius LLP

(57) ABSTRACT

A semiconductor package includes: a first substrate including lower bonding pads; at least one semiconductor chip disposed on the first substrate; bumps disposed on a first surface of the first substrate; and a mold layer disposed on the first substrate and covering the at least one semiconductor chip, wherein the bumps include: a pillar portion bonded to the first surface of the first substrate; a solder portion bonded to a first surface of the pillar portion; and a metal layer including a material including high-melting-point metal atoms, wherein the metal layer covers a first surface of the solder portion, wherein the solder portion includes the high-melting-point metal atoms.

20 Claims, 16 Drawing Sheets

SEMICONDUCTOR PACKAGE

CROSS-REFERENCE TO RELATED APPLICATIONS

This U.S. non-provisional patent application claims priority under 35 U.S.C. § 119 to Korean Patent Application No. 10-2023-0079058, filed on Jun. 20, 2023, in the Korean Intellectual Property Office, the disclosure of which is incorporated by reference herein in its entirety.

TECHNICAL FIELD

The present inventive concept relates to a semiconductor package, and in particular, to a semiconductor package including a bump.

Discussion of the Related Art

The demand for an electrode terminal structure with many pins having a small pitch is increasing rapidly in a semiconductor package. Accordingly, research on the miniaturization of semiconductor packages is increasing. In general, the semiconductor package has an electric connection terminal (e.g., a solder ball or a solder bump) for forming an electric connection with another electronic device or a printed circuit board. Currently, semiconductor packages with highly-reliable connection terminals are under development.

SUMMARY

According to an embodiment of the present inventive concept, a semiconductor package includes: a first substrate including lower bonding pads; at least one semiconductor chip disposed on the first substrate; bumps disposed on a first surface of the first substrate; and a mold layer disposed on the first substrate and covering the at least one semiconductor chip, wherein the bumps include: a pillar portion bonded to the first surface of the first substrate; a solder portion bonded to a first surface of the pillar portion; and a metal layer including a material including high-melting-point metal atoms, wherein the metal layer covers a first surface of the solder portion, wherein the solder portion includes the high-melting-point metal atoms.

According to an embodiment of the present inventive concept, a semiconductor package includes: a first substrate including lower bonding pads; at least one semiconductor chip disposed on the first substrate; bumps bonded to the lower bonding pads; and a mold layer disposed on the first substrate and covering the at least one semiconductor chip, wherein the bumps include: a pillar portion bonded to a bottom surface of the lower bonding pad; a solder portion bonded to a bottom surface of the pillar portion; and a metal layer covering a bottom surface of the solder portion, wherein the metal layer includes a material including high-melting-point metal atoms, wherein the pillar portion includes: a first copper pillar pattern disposed on the lower bonding pad; a nickel pillar pattern disposed on the first copper pillar pattern; and a second copper pillar pattern disposed on the nickel pillar pattern, wherein the solder portion includes: crystal grains including tin atoms; and the high-melting-point metal atoms, which are present in an interface between the crystal grains, wherein the high-melting-point metal atoms includes at least one of titanium (Ti) or copper (Cu) atoms, a melting temperature of the high-melting-point metal atoms is higher than a melting temperature of tin (Sn), a distance between centers of the bumps ranges from about 1 μm to about 200 μm, a height of each of the bumps ranges from about 1 μm to about 100 μm, and a thickness of the metal layer ranges from about 1 nm to about 1 μm.

According to an embodiment of the present inventive concept, a semiconductor package includes: a package substrate; an interposer substrate disposed on the package substrate, and including lower bonding pads; at least one semiconductor chip disposed on the interposer substrate; inner connection members connecting the interposer substrate to the at least one semiconductor chip; bumps disposed on a first surface of the interposer substrate; and a mold layer disposed on the interposer substrate and covering the at least one semiconductor chip, wherein the bumps include: a pillar portion bonded to the interposer substrate; a solder portion bonded to the pillar portion; and a metal layer covering a bottom surface of the solder portion, wherein the metal layer includes a material including high-melting-point metal atoms, wherein the pillar portion includes: a first copper pillar pattern in contact with the lower bonding pad; a nickel pillar pattern disposed on the first copper pillar pattern; and a second copper pillar pattern disposed on the nickel pillar pattern, wherein the solder portion includes an intermetallic compound, which includes the high-melting-point metal atoms and tin atoms, and wherein a melting temperature of the high-melting-point metal atoms is higher than a melting temperature of tin (Sn).

DETAILED DESCRIPTION OF THE EMBODIMENTS

Embodiments of the present inventive concepts will now be described more fully with reference to the accompanying drawings, in which embodiments of the present inventive concept are shown.

Figure 1A:
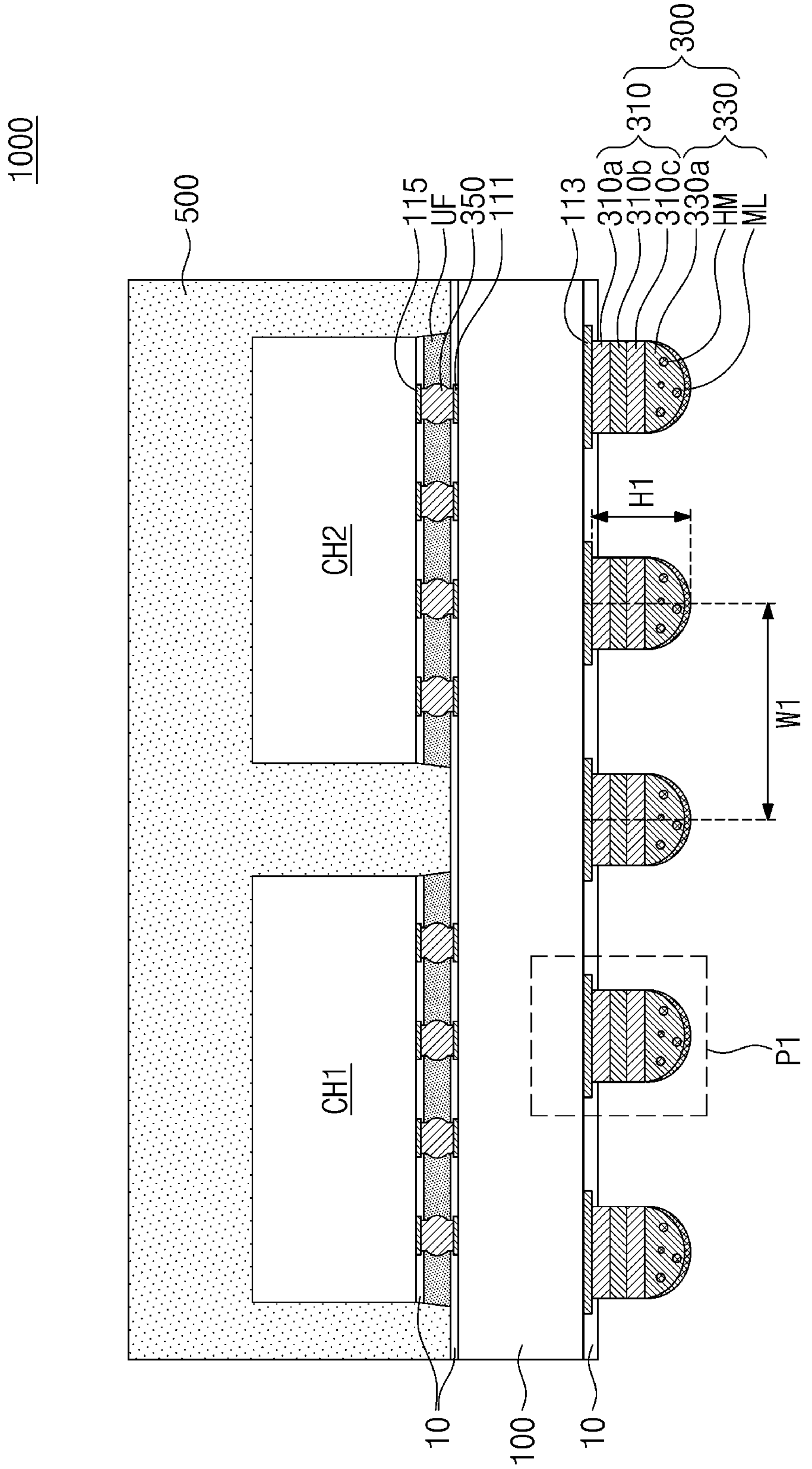
FIG. 1A is a sectional view illustrating a semiconductor package according to an embodiment of the present inventive concept.
Figure 1B:
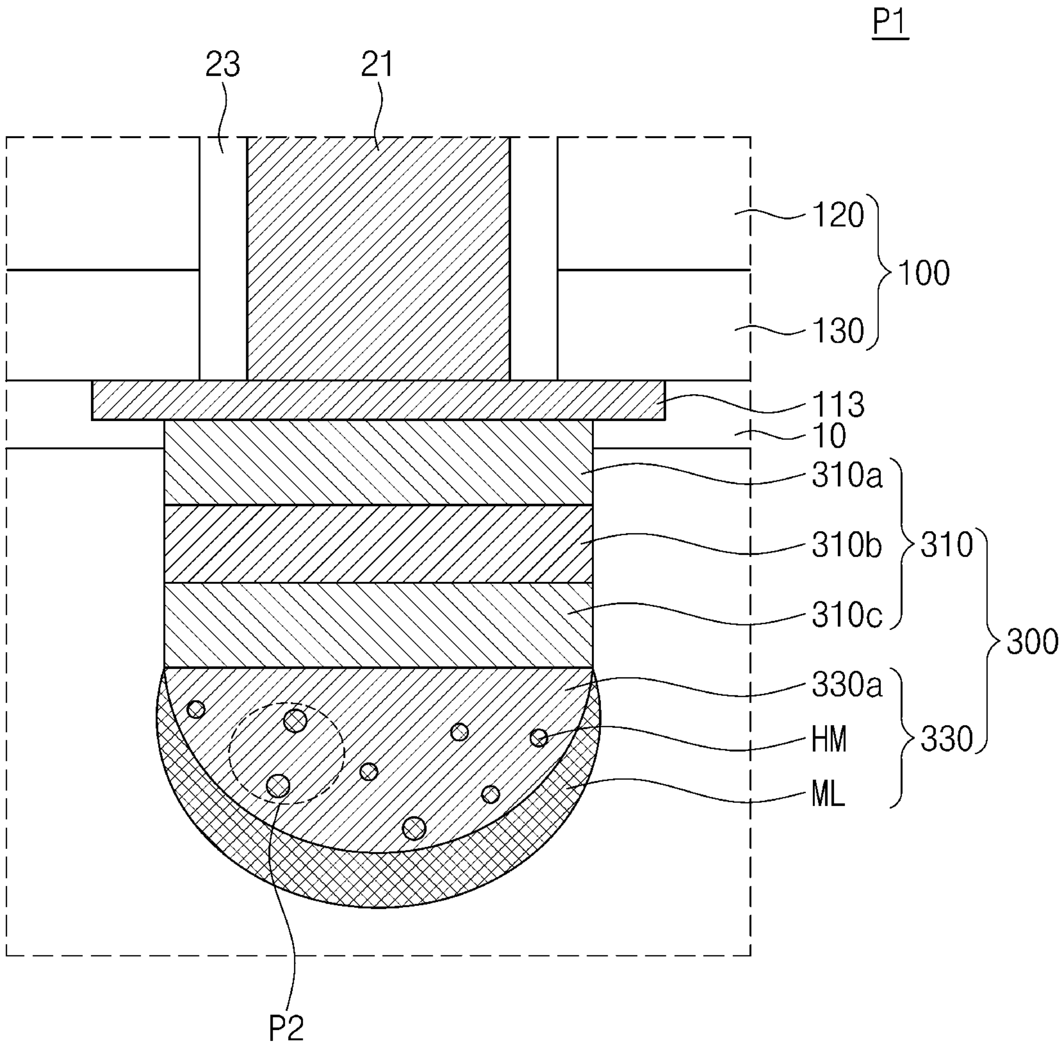
FIGS. 1B and 1C are enlarged sectional views illustrating a portion 'P1' of FIG. 1A.
Figure 1C:
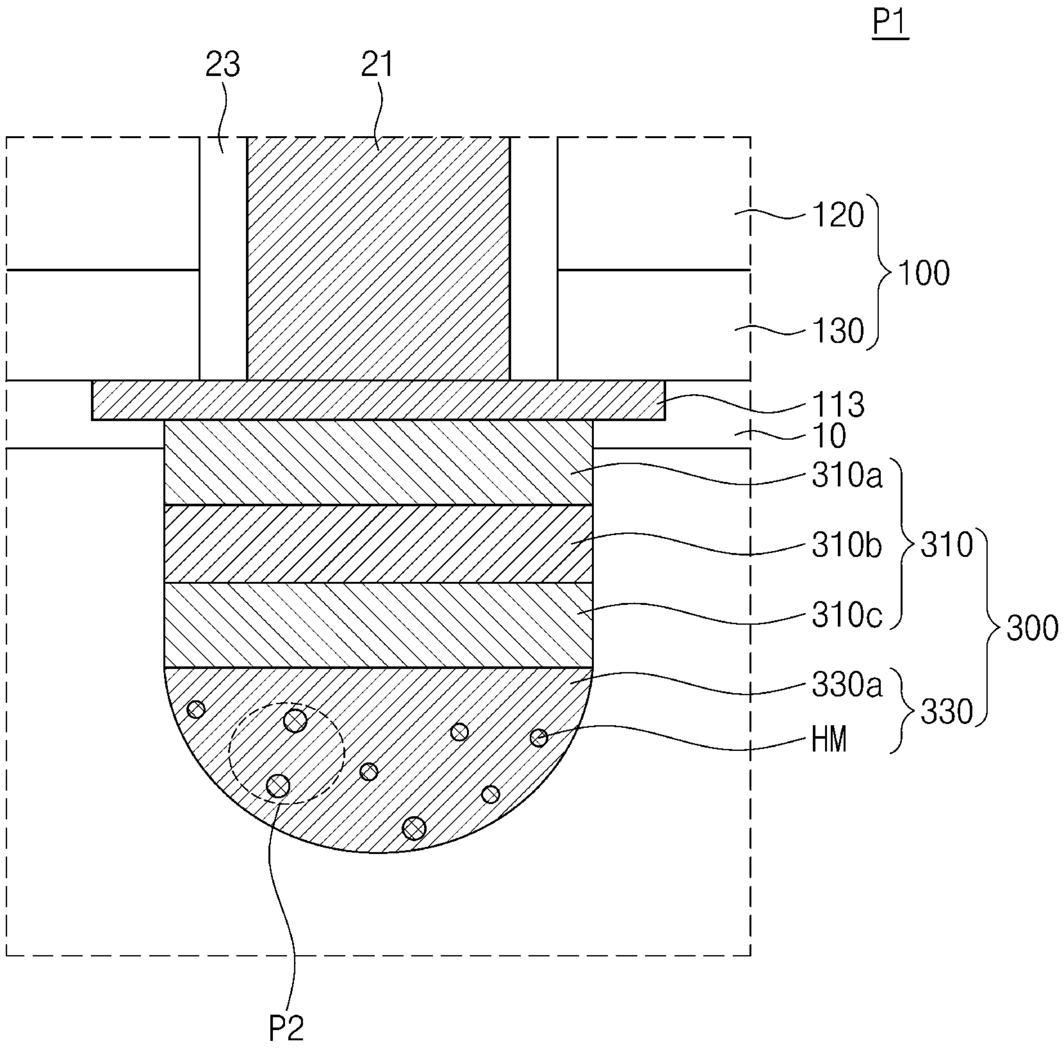
Figure 1D:
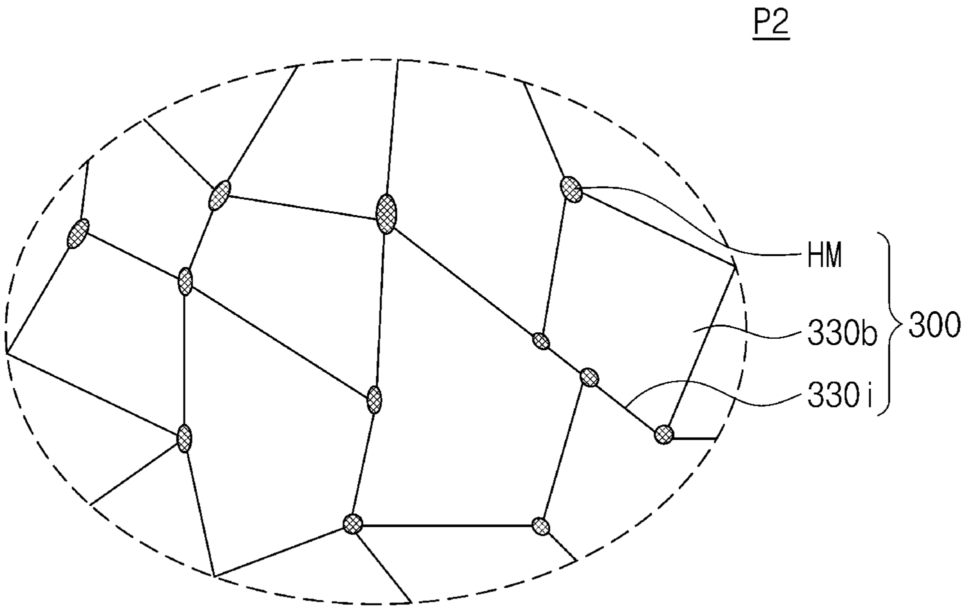
FIG. 1D is an enlarged sectional view illustrating a portion 'P2' of FIGS. 1B and 1C.

FIG. 1A is a sectional view illustrating a semiconductor package according to an embodiment of the present inventive concept. FIGS. 1B and 1C are enlarged sectional views illustrating a portion 'P1' of FIG. 1A. FIG. 1D is an enlarged sectional view illustrating a portion 'P2' of FIGS. 1B and 1C.

Referring to FIGS. 1A, 1B, and 1C, a semiconductor package 1000 in the present embodiment may include a first substrate 100, a first semiconductor chip CH1, a second semiconductor chip CH2, bumps 300, and a mold layer 500.

The first substrate 100 may be a semiconductor substrate (e.g., a semiconductor wafer). The first substrate 100 may be formed of or include at least one of semiconductor materials (e.g., silicon, germanium, or silicon germanium). The first substrate 100 may include a circuit pattern provided therein. For example, the circuit pattern may be a memory circuit including one or more transistors, a logic circuit including one or more transistors, or combinations thereof. However, the present inventive concept is not limited to this example, and the afore-described circuit pattern may not be provided in the first substrate 100. The first substrate 100 may further include a first semiconductor substrate 120, internal lines, and an insulating layer. The first semiconductor substrate 120 may be a single-crystalline semiconductor substrate or a silicon-on-insulator (SOI) substrate. The first substrate 100 may also be referred to as an 'interposer substrate' or 'package substrate'. In addition, the first substrate 100 may be a double-sided or multi-layered printed circuit board.

Upper bonding pads 111 may be disposed on a top surface of the first substrate 100, and lower bonding pads 113 may be disposed on a bottom surface of the first substrate 100. The upper bonding pads 111 and the lower bonding pads 113 may include at least one of metallic materials (e.g., aluminum or copper). The upper bonding pads 111 may be electrically connected to the lower bonding pads 113, respectively.

A passivation layer 10 may be provided on the top surface of the first substrate 100 to cover the upper bonding pads 111. The passivation layer 10 may be provided on the bottom surface of the first substrate 100 to cover the lower bonding pads 113. The passivation layer 10 may be formed of or include at least one of, for example, silicon oxide, silicon nitride, and/or silicon carbon nitride (SiCN) and may have a single- or multi-layered structure.

The bumps 300 may be disposed on the bottom surface of the first substrate 100. The bumps 300 may include a pillar portion 310, a solder portion 330, and a metal layer ML. A distance between centers of the bumps 300 may range from about 1 μm to about 200 μm, and a height of the bumps 300 may range from about 1 μm to about 100 μm.

The pillar portion 310 may be bonded to a bottom surface of the lower bonding pad 113. The pillar portion 310 may include a first copper pillar pattern 310*a*, which is in contact with the lower bonding pad 113, a nickel pillar pattern 310*b*, which is placed on the first copper pillar pattern 310*a*, and a second copper pillar pattern 310*c*, which is placed on the nickel pillar pattern 310*b*. For example, each of the first copper pillar pattern 310*a* and the second copper pillar pattern 310*c* may be formed of or include copper (Cu). For example, each of the nickel pillar pattern 310*b* may be formed of or include nickel (Ni). However, the present inventive concept is not limited to this example, and one or more metal patterns (e.g., under bump metallurgy (UBM) pattern, a diffusion barrier layer, an adhesion layer, a wetting layer, or an oxidation preventing agent) may be additionally disposed in the pillar portion 310. The nickel pillar pattern 310*b* may serve as a diffusion barrier layer.

The solder portion 330 may be bonded to a bottom surface of the pillar portion 310 and may be in contact with the second copper pillar pattern 310*c*. The solder portion 330 may include a solder layer 330*a*, the metal layer ML, and high-melting-point metal atoms HM. The high-melting-point metal atoms HM may include at least one of titanium (Ti) and/or copper (Cu) atoms. The solder portion 330 may be composed of an intermetallic compound (IMC), which includes the high-melting-point metal atoms HM and tin (Sn) atoms.

The metal layer ML may be formed to cover a bottom surface of the solder layer 330*a*. The metal layer ML may include the high-melting-point metal atoms HM. An intermetallic compound (IMC) may be formed between the solder portion 330 and the metal layer ML by heat that is generated during a chip-on-wafer (CoW) process of bonding a plurality of semiconductor chips CH1 and CH2 to the first substrate 100. A melting temperature of the high-melting-point metal atoms HM may be higher than a melting temperature of tin (Sn). The metal layer ML may have a thickness ranging from about 1 nm to about 1 μm. A concentration of the high-melting-point metal atoms HM in the solder portion 330 may decrease as a distance to the pillar portion 310 decreases. The nickel pillar pattern 310*b* of the pillar portion 310 may serve as a diffusion barrier preventing the high-melting-point metal atoms HM and the intermetallic compound from being diffused into the pillar portion 310.

Referring to FIG. 1D, the solder portion 330 may include crystal grains 330*b*, and the high-melting-point metal atoms HM may be present in an interface 330*i* between the crystal grains 330*b*. The crystal grains 330*b* may constitute the solder layer 330*a* of FIG. 1B or 1C. For example, in the case where the metal layer ML includes titanium (Ti), titanium atoms may be diffused into the solder portion 330, and in this case, the titanium atoms may be present in the interface 330*i* between the crystal grain 330*b* of the solder portion 330. As another example, in the case where the metal layer ML includes copper (Cu), an intermetallic compound (IMC) (e.g., $Cu_5Sn$ or $Cu_6Sn_5$) may be formed in the solder portion 330 to increase the strength of the solder portion 330. However, the present inventive concept is not limited to this example, and in an embodiment of the present inventive concept, the metal layer ML may include various metallic elements (e.g., silver (Ag)) whose melting temperature is higher than that of tin (Sn).

Referring back to FIGS. 1A to 1C, the first substrate 100 may further include a penetration via 21 and a penetration insulating layer 23. The penetration via 21 may be provided to penetrate a portion of the first substrate 100. The penetration insulating layer 23 may be interposed between the penetration via 21 and the first substrate 100. For example, the penetration insulating layer 23 may include a silicon oxide layer. A protection layer 130 may cover the penetration via 21, the lower bonding pads 113, and the first semiconductor substrate 120. The protection layer 130 may be formed of or include an insulating material. The passivation layer 110 may cover the protection layer 130 and the lower bonding pads 113. For example, the protection layer 130 and the lower bonding pads 113 may be disposed on the passivation layer 10. The first substrate 100 and the bumps 300 may be electrically connected to each other by the penetration vias 21. Inner solder balls 350 (e.g., inner connection members) and the bumps 300 may be electrically connected to each other by the penetration vias 21.

At least one semiconductor chip may be disposed on the first substrate 100. As shown in FIG. 1A, the first and second semiconductor chips CH1 and CH2 may be disposed on the first substrate 100 to be parallel to each other. Each of the first and second semiconductor chips CH1 and CH2 may include a logic chip, such as an application processor (AP) chip (e.g., a micro-processor and a micro controller), a central processing unit (CPU), a graphics processing unit (GPU), a modem, an application-specific IC (ASIC), and a field programmable gate array (FPGA). In addition, the first and second semiconductor chips CH1 and CH2 may include a volatile memory chip (e.g., DRAM and SRAM chips) or a nonvolatile memory chip (e.g., PRAM, MRAM, RRAM, and FLASH memory chips). For example, the first semiconductor chip CH1 may include a modem chip, and the second semiconductor chip CH2 may include a DRAM chip. However, the present inventive concept is not limited to this example. Two or more semiconductor chips may be disposed on the first substrate 100.

Chip pads 115 may be disposed on bottom surfaces of the semiconductor chips CH1 and CH2. The chip pads 115 may be formed of or include at least one of metallic materials (e.g., aluminum or copper). The passivation layer 10 may be provided on the bottom surfaces of the semiconductor chips CH1 and CH2 to cover the chip pads 115. The passivation layer 10 may be formed of or include an insulating material. The first substrate 100 and the semiconductor chips CH1 and CH2 may be electrically connected to each other through the inner solder balls 350. The high-melting-point metal atom HM may be absent in the inner solder balls 350. The inner solder balls 350 may electrically connect the upper bonding pads 111 of the first substrate 100 to the chip pads 115 of the semiconductor chips CH1 and CH2. An under fill UF protecting the inner solder balls 350 may be interposed between the first substrate 100 and the semiconductor chips CH1 and CH2, and the under fill UF may be formed of or include, for example, an epoxy resin.

The mold layer 500 may be provided to cover the first substrate 100, the first semiconductor chip CH1, and the second semiconductor chip CH2. The mold layer 500 may be disposed on the first substrate 100. The mold layer 500 may be formed of or include an insulating resin (e.g., an epoxy molding compound (EMC)). The mold layer 500 may further include fillers, which are dispersed in an insulating resin. In an embodiment of the present inventive concept, the filler may be formed of or include silicon oxide ($SiO_2$). A structure of the semiconductor package 1000, in which the first substrate 100 including the bumps 300 and a plurality of semiconductor chips are covered with the mold layer 500, may be referred to as a molding-in-package (MIP).

The metal layer ML and the intermetallic compound (IMC) may be used to protect the solder portion 330 of the bumps 300, when the bumps 300 are exposed to the relatively hot environment during the CoW process, and thus, it may be possible to prevent physical damage (e.g., deformation) of the solder portion 330 of the bumps 300. In addition, since the solder portion 330 of the bumps 300 is prevented from being damaged, it may be possible to reduce a wetting failure (e.g., a non-wet issue) between the solder portion 330 and the package substrate in a process of bonding the semiconductor package 1000 of the MIP structure to a package substrate, and it may be possible to increase the bonding yield of the semiconductor package. Next, the metal layer ML may be removed in the fabrication process of the semiconductor package 1000.

In the fabrication process of the semiconductor package, the metal layer ML may be incompletely removed and may be present in the solder portion 330, as shown in FIG. 1B. In addition, the metal layer ML may be removed, and the high-melting-point metal atoms HM and the intermetallic compound may be present in the solder portion 330, as shown in FIG. 1C.

FIGS. 2A to 21 are sectional views sequentially illustrating a process of fabricating the semiconductor package of FIG. 1A. Hereinafter, a previously described element may be identified by the same reference number without repeating an overlapping description thereof, and thus, redundant descriptions may be omitted or briefly described.

Figure 2A:
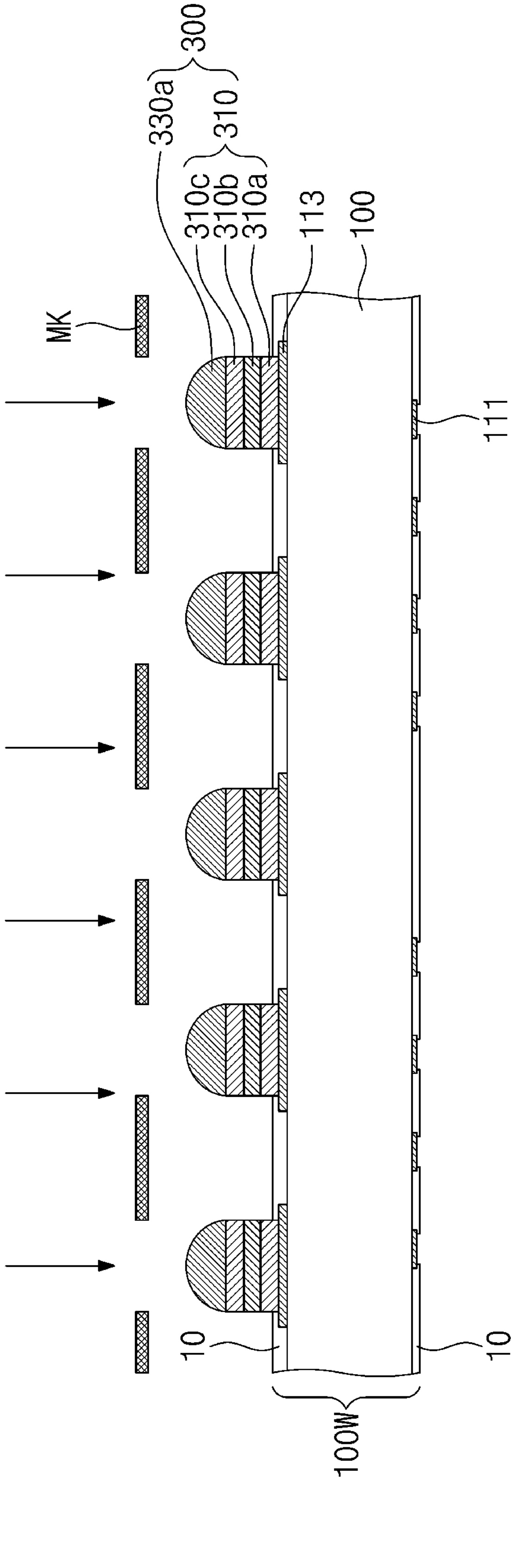
FIGS. 2A, 2B, 2C, 2D, 2E, 2F, 2G, 2H, and 2I are sectional views sequentially illustrating a process of fabricating the semiconductor package of FIG. 1A according to an embodiment of the present inventive concept.

Referring to FIGS. 1A and 2A, a first wafer 100W may be prepared. The first wafer 100W may include the first substrate 100. The upper bonding pads 111, the lower bonding pads 113, the bumps 300, and the passivation layer 10 may be formed on the first substrate 100.

Referring to FIG. 2A, after the formation of the bumps 300, the first wafer 100W may be prepared such that the bumps 300 are placed at a top level of the first wafer 100W. The metal layer ML, which contains the high-melting-point metal atom HM, may be formed on the solder layer 330*a* of the bumps 300 by, for example, a metal sputtering process. For example, a mask pattern MK may be placed on the first wafer 100W to cover the top surface of the first substrate 100 and expose only the solder layer 330*a* of the bumps 300. A process of colliding the plasma of an inert gas (e.g., Ar gas) with a target made of a high-melting-point metal may be performed in a sputtering chamber, and in this case, the high-melting-point metal atoms HM, which are ejected from the target, may be deposited on the solder layer 330*a* to form the metal layer ML. The metal layer ML may be deposited on an outer surface of the mask pattern MK.

Figure 2B:
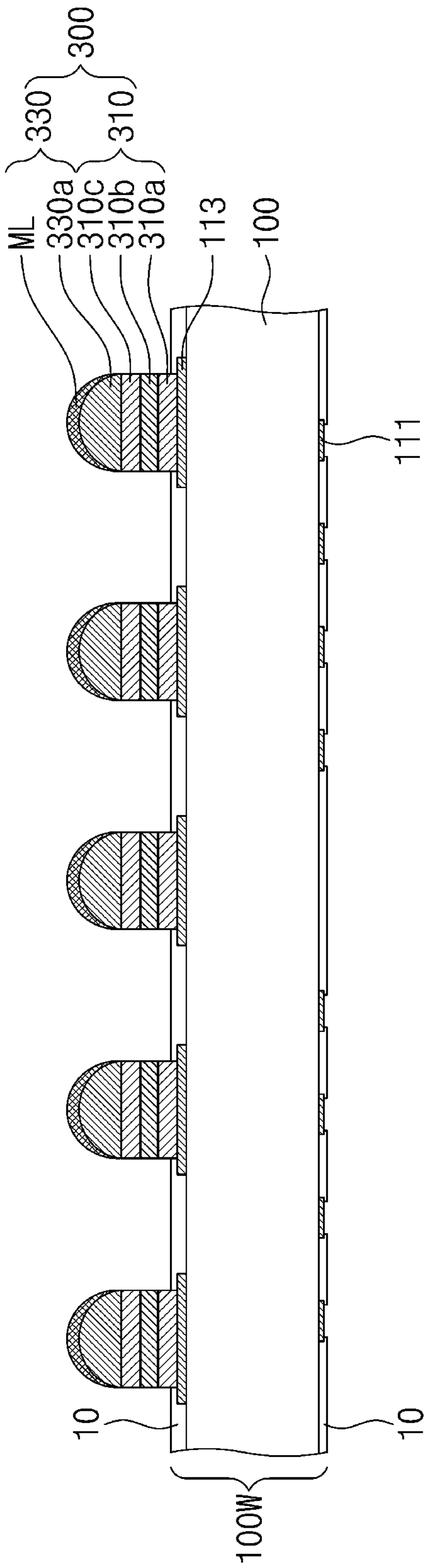

Referring to FIG. 2B, the mask pattern MK may be removed, after the metal sputtering process, and here, the metal layer ML on the bottom surface of the solder portion 330 may have a deposition thickness ranging from about 1 nm to about 1 μm.

Figure 2C:
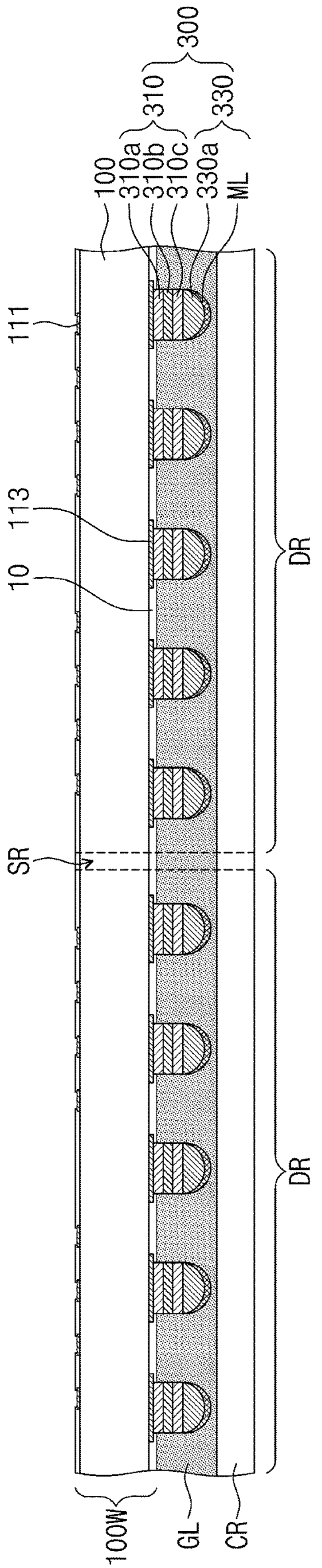

Referring to FIG. 2C, the first wafer 100W, which includes the bumps 300 that are provided with the metal layer ML, may be prepared. The first wafer 100W may have a plurality of chip regions DR and a separation region SR between the plurality of chip regions DR. Each of the chip regions DR of the first wafer 100W may be provided to have substantially the same structure as the semiconductor package described with reference to FIGS. 1A to 1D. The separation region SR may be a scribe lane region. The first wafer 100W may be inverted such that the bumps 300 are placed at a bottom level, and then, the first wafer 100W may be bonded to a carrier wafer CR with an adhesive layer GL interposed the first wafer 100W and the carrier wafer CR. The adhesive layer GL may include at least one of adhesive, thermosetting, thermoplastic, and/or photo-curable resins.

Figure 2D:
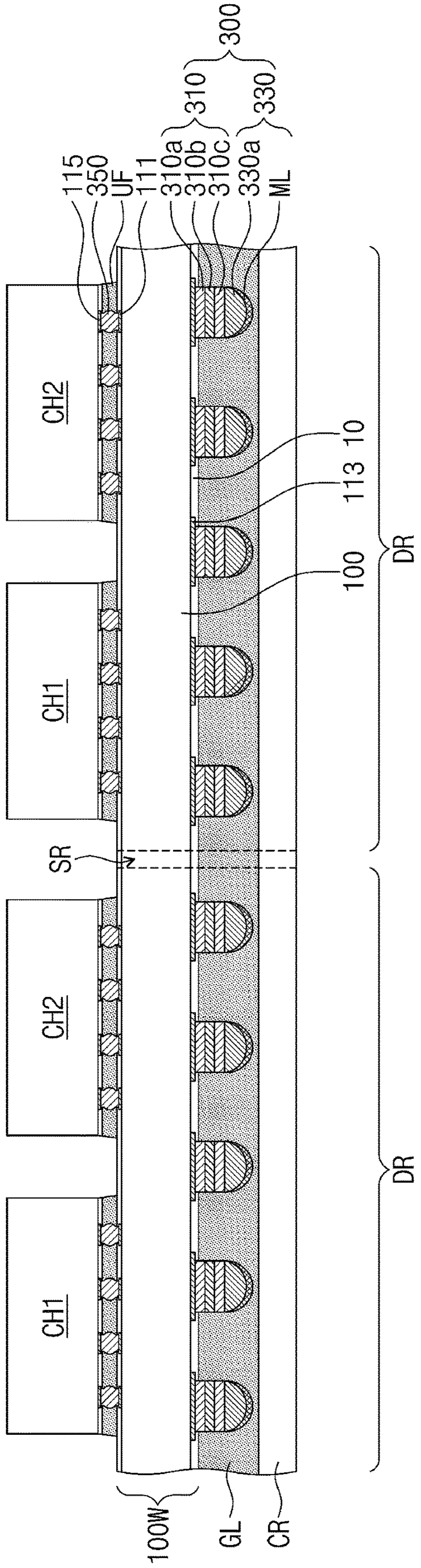

Referring to FIG. 2D, the semiconductor chips CH1 and CH2 may be prepared. The semiconductor chips CH1 and CH2 may be disposed on the chip regions DR of the first wafer 100W. Here, the inner solder balls 350 may be interposed between the semiconductor chips CH1 and CH2 and the first substrate 100. The inner solder balls 350 may be formed of or include tin (Sn), and the high-melting-point metal atom HM may be absent in the inner solder balls 350. The semiconductor chips CH1 and CH2 may be bonded to the first substrate 100 in a flip-chip bonding manner.

Figure 2E:
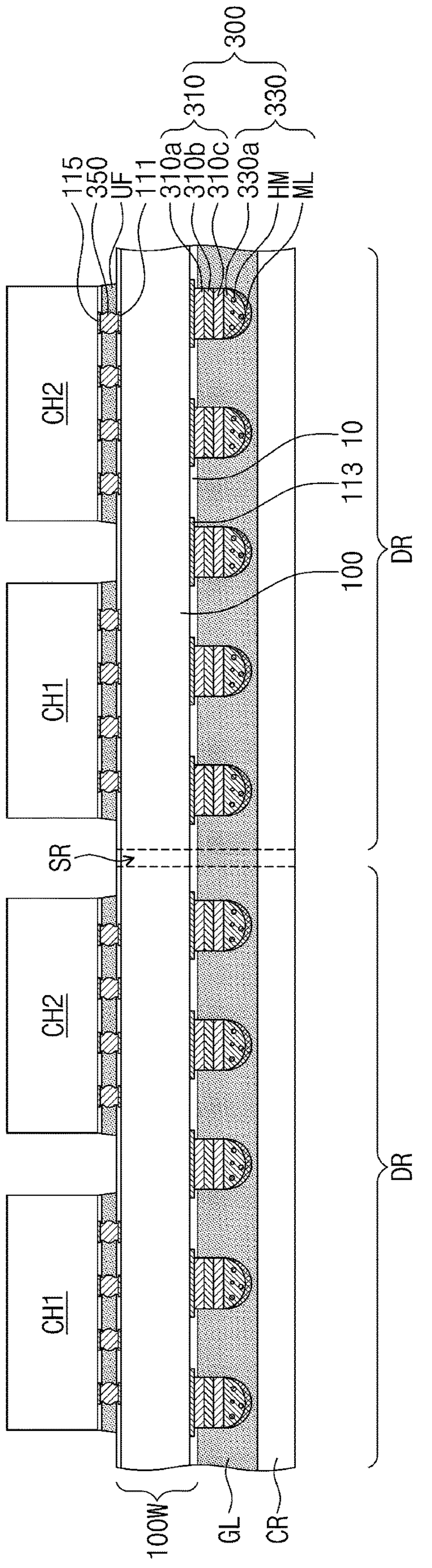

Referring to FIGS. 2D and 2E, a reflow process may be performed to attach the semiconductor chips CH1 and CH2 to the first substrate 100, and here, heat energy may be supplied in upward and downward directions to cause a reaction between the high-melting-point metal atoms HM in the metal layer ML and metal materials (e.g., tin (Sn) and silver (Ag)) in the solder portion 330, thereby forming the intermetallic compound (IMC). For example, in the case where the metal layer ML includes titanium (Ti), titanium atoms may be diffused into the solder portion 330, and the titanium atoms may be present in the interface 330*i* between the crystal grains 330*b* of the solder portion 330. Thus, an intermetallic compound (IMC), which includes tin atoms of the solder portion 330 and titanium atoms, may be formed in the solder portion 330 to increase the strength of the solder portion 330. As another example, in the case where the metal layer ML includes copper (Cu), an intermetallic compound (IMC) (e.g., $Cu_5Sn$ or $Cu_6Sn_5$), which includes tin (Sn) of the solder portion 330 and copper (Cu), may be formed in the solder portion 330 to increase the strength of the solder portion 330. The intermetallic compound (IMC) may be formed throughout the solder portion 330 or may be formed to infiltrate the solder portion 330 along a boundary between the solder portion 330 and the metal layer ML while covering the surface of the solder portion 330 (e.g., the solder layer 330*a*). A concentration of the high-melting-point metal atoms HM in the solder portion 330 may decrease as a distance to the pillar portion 310 decreases. The intermetallic compound (IMC) may prevent an undesired chemical reaction between the polymers of the solder portion 330 and the materials of the adhesive layer, which may be caused by heat that is supplied during the reflow process, and thus, it may be possible to reduce the damage of the bumps 300 and increase the reliability of the semiconductor package.

In the case where the steps of FIGS. 2A and 2B are omitted, the metal layer ML including the high-melting-point metal atoms HM might not be formed, and in this case, the solder layer 330*a* of the bumps 300, which are attached to the carrier wafer CR, may be thermally deformed or damaged by the heat energy that is supplied in the upward and downward directions during the reflow process of attaching the semiconductor chips CH1 and CH2 to the first substrate 100. However, according to an embodiment of the present inventive concept, such a problem may be prevented or suppressed.

Figure 2F:
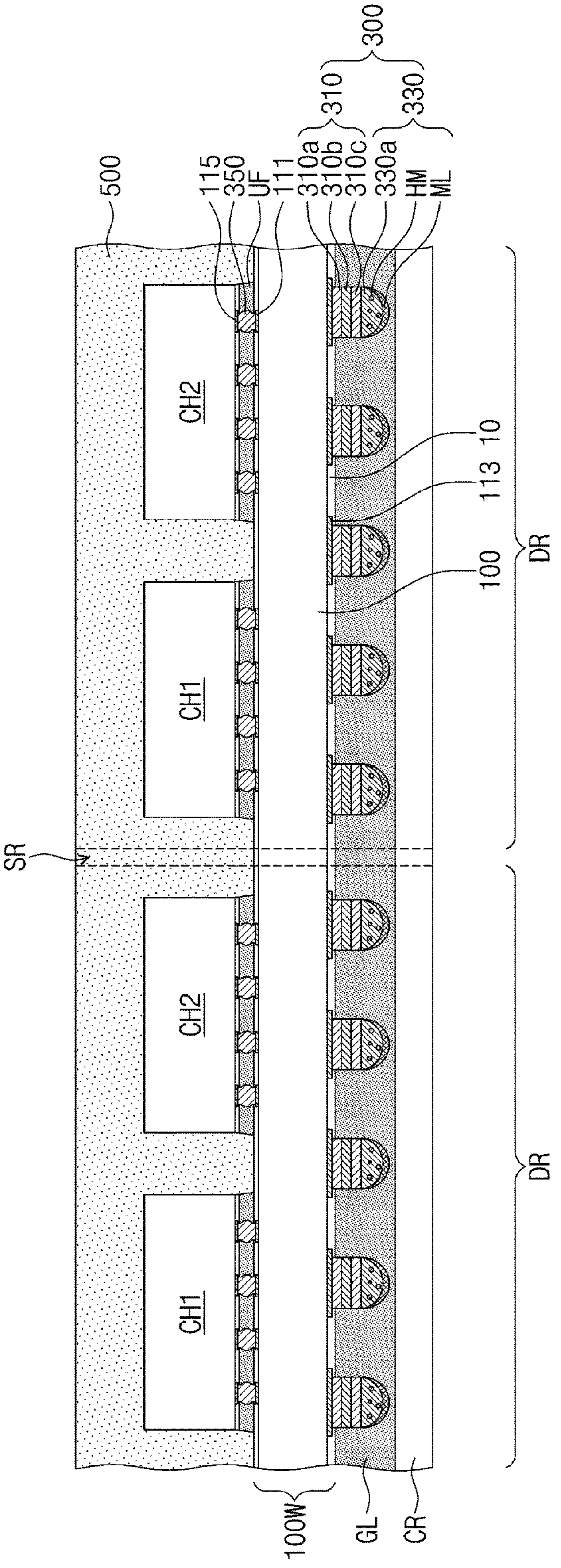

Referring to FIG. 2F, a molding process may be performed to form the mold layer 500 covering the top surface of the first wafer 100W and the top and side surfaces of the semiconductor chips CH1 and CH2. The mold layer 500 may be formed of or include an insulating polymer (e.g., an epoxy molding compound (EMC)).

Figure 2G:
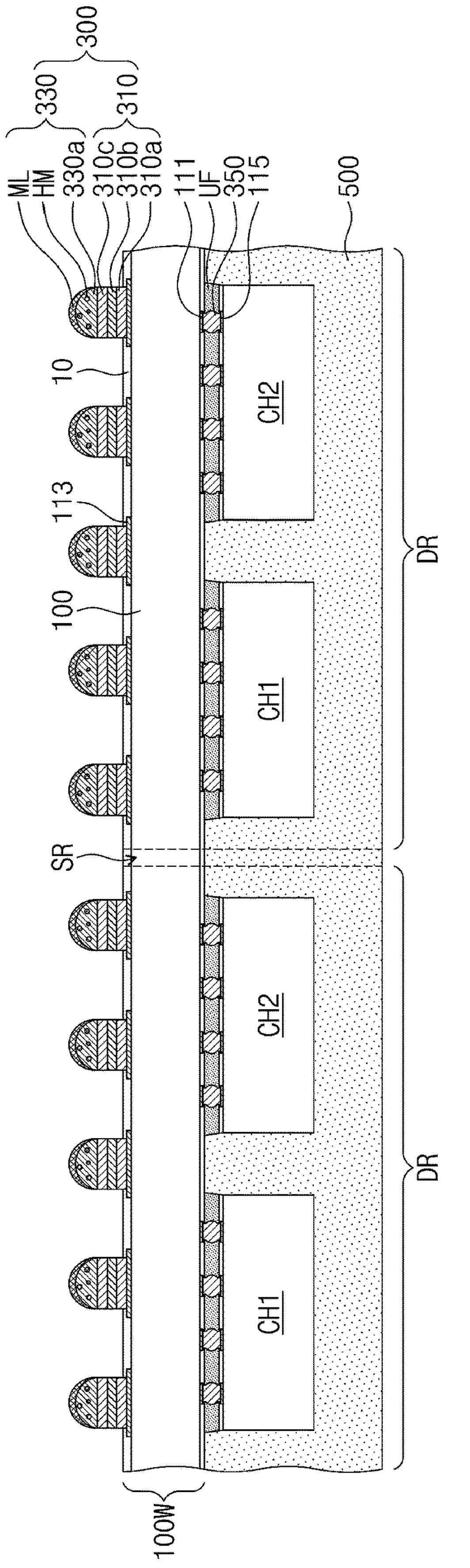

Referring to FIG. 2G, the first wafer 100W may be detached from the adhesive layer, and then, the first wafer 100W may be inverted such that the bumps 300 are placed at its top level. Thereafter, a glue cleaning process may be performed.

Figure 2H:
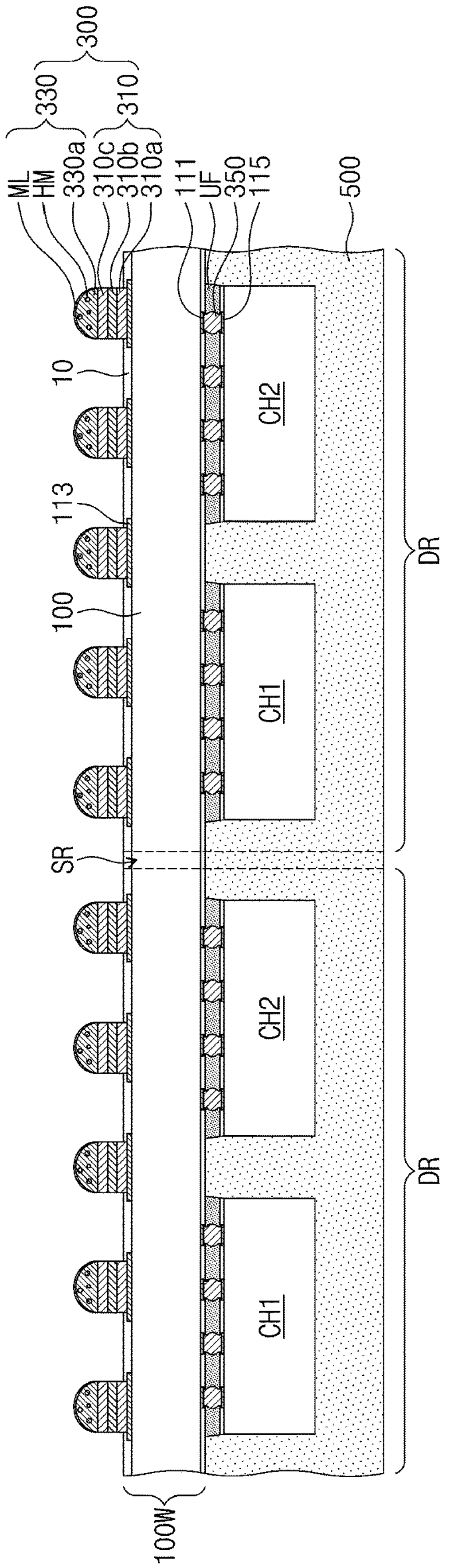

Referring to FIG. 2H, after the glue cleaning process, an etching process may be performed to remove the metal layer ML from the surface of the solder portion 330. The etching process may be performed using a dry or wet etching method. In an embodiment of the present inventive concept, the metal layer ML might not be completely removed, and may be partly left on the surface of the solder portion 330, even after the etching process is finished.

Figure 2I:
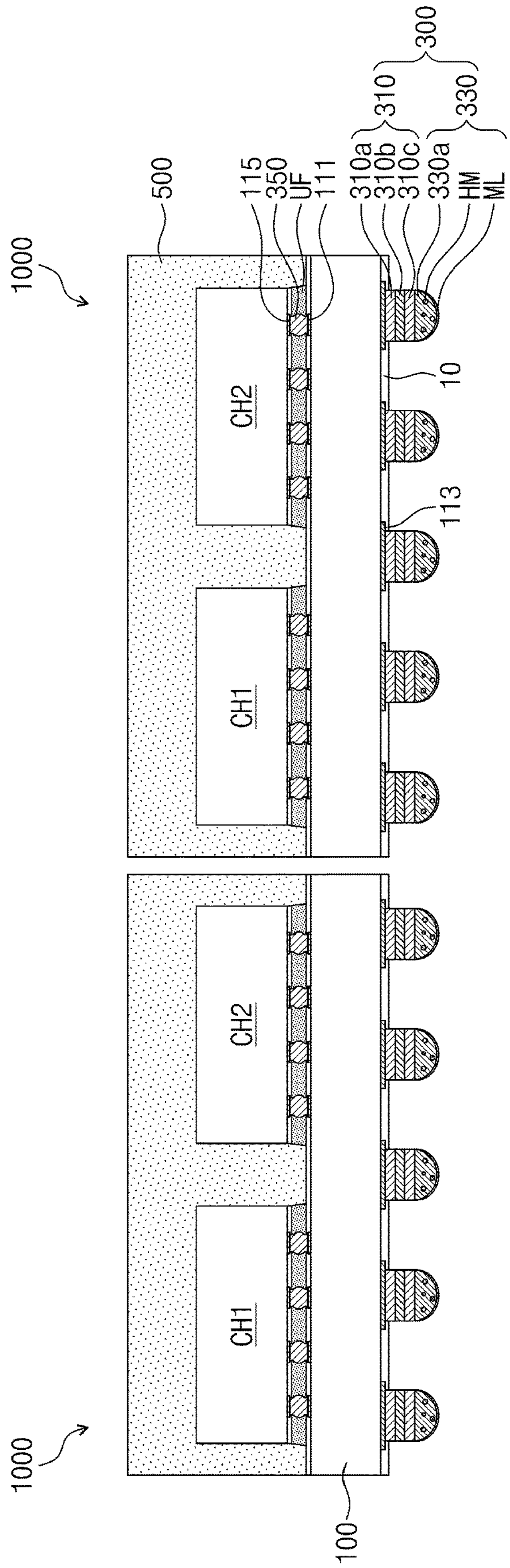

Referring to FIG. 2I, a dicing process using a laser beam or the like may be performed to remove the separation region SR, and as a result, a plurality of semiconductor packages 1000 may be formed. Each of the semiconductor packages 1000 may be formed to have substantially the same structure as that shown in FIG. 1A.

Figure 3:
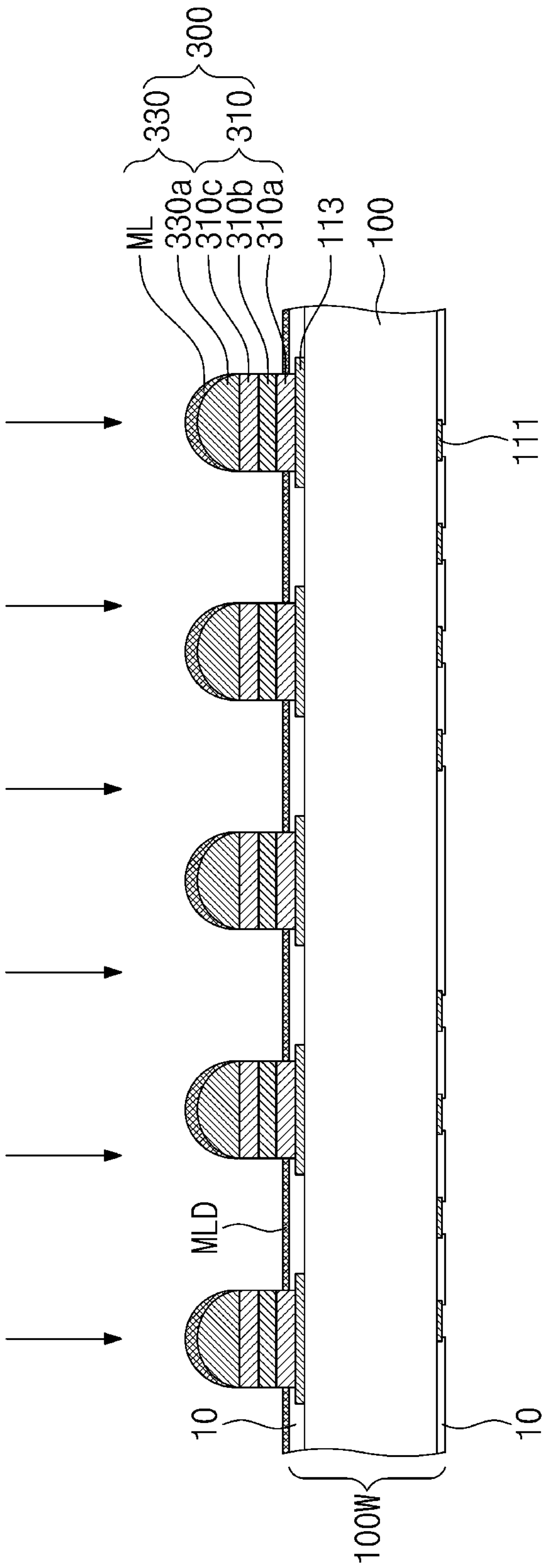
FIG. 3 is a sectional view illustrating a process of fabricating the semiconductor package of FIG. 1A.

FIG. 3 is a sectional view illustrating a process of fabricating the semiconductor package of FIG. 1A.

Referring to FIG. 3, the metal layer ML may be formed as a part of the solder portion 330 of the bumps 300. Unlike the structure shown in FIG. 2A, a metal sputtering process may be performed, without a step of forming the mask pattern MK. After the formation of the bumps 300, the first wafer 100W may be prepared such that the bumps 300 are placed at an upper level. The metal layer ML including the high-melting-point metal atom HM may be formed on the solder layer 330*a* of the bumps 300 by the metal sputtering process. A process of colliding the plasma of an inert gas (e.g., Ar gas) with a target made of a high-melting-point metal may be performed in a sputtering chamber, and in this case, the high-melting-point metal atoms HM, which are ejected from the target, may be deposited on the solder layer 330*a* to form the metal layer ML. The high-melting-point metal atoms HM may be deposited on the passivation layer 10 of the first wafer 100W to form a metal film MLD. After the metal sputtering process, an etching process may be performed to remove the metal film MLD that is deposited on the passivation layer 10. The etching process may include a dry etching process or a wet etching process. As a result of the removal of the metal film MLD that is deposited on the passivation layer 10, the metal layer ML, which has a thickness of about 1 nm to about 1 μm, may be formed on the bottom surface of the solder layer 330*a*, as shown in FIG. 2B. Other steps of the fabrication process may be performed in the same or equivalent manner as described with reference to FIGS. 2C to 2I.

Figure 4:
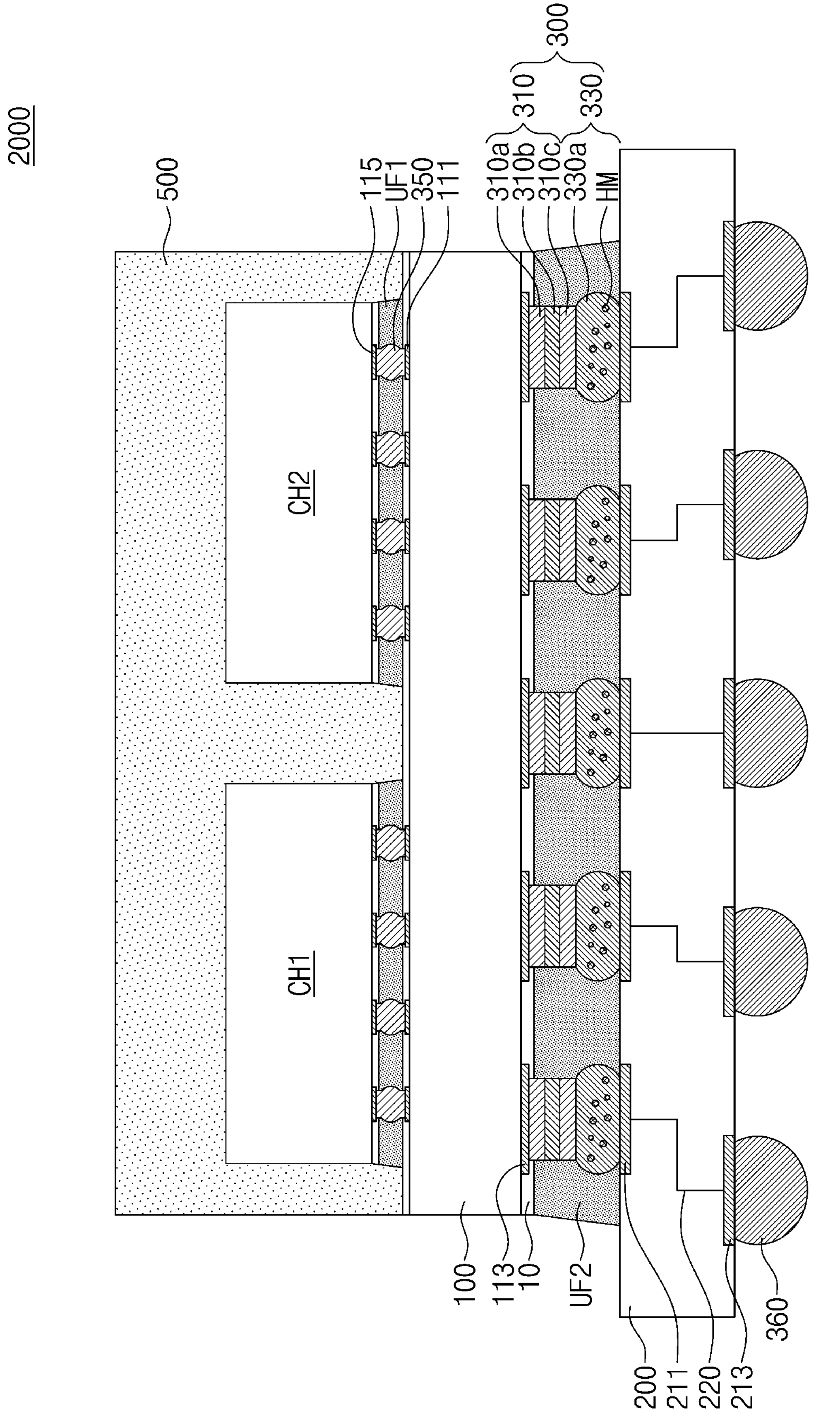
FIG. 4 is a sectional view illustrating a semiconductor package according to an embodiment of the present inventive concept.

FIG. 4 is a sectional view illustrating a semiconductor package according to an embodiment of the present inventive concept.

Referring to FIG. 4, a semiconductor package 2000 may be provided. In the semiconductor package 2000, a second substrate 200 may be disposed below the first substrate 100. The first substrate 100 may be, for example, a silicon-containing interposer substrate. In an embodiment of the present inventive concept, the second substrate 200 may be a package substrate including a double-sided or multi-layered printed circuit.

At least one semiconductor chip may be disposed on the first substrate 100. As shown in FIG. 4, the first and second semiconductor chips CH1 and CH2 may be disposed on the first substrate 100 to be parallel to each other. Each of the first and second semiconductor chips CH1 and CH2 may include a logic chip or a memory chip. Two or more semiconductor chips may be disposed on the first substrate 100. The first substrate 100 and the first to second semiconductor chips CH1 and CH2 may be electrically connected to each other by the inner solder balls 350. The high-melting-point metal atom HM may be absent in the inner solder balls 350. A first under fill UF1, which may protect the inner solder balls 350, may be interposed between the first substrate 100 and the first to second semiconductor chips CH1 and CH2, and the first under fill UF1 may be formed of or include, for example, an epoxy resin.

The first substrate 100 may include the upper bonding pads 111 and the lower bonding pads 113, which are respectively provided on top and bottom surfaces of the first substrate 100. The bumps 300 may be disposed on the bottom surface of the first substrate 100. The first substrate 100 may be bonded to the second substrate 200 by the bumps 300. A second under fill UF2, which may protect the bumps 300, may be interposed between the first substrate 100 and the second substrate 200, and the second under fill UF2 may be formed of or include, for example, an epoxy resin.

The bumps 300 may include the pillar portion 310, the solder portion 330, and the metal layer ML. The pillar portion 310 may be bonded to the bottom surface of the lower bonding pads 113. The pillar portion 310 may include the first copper pillar pattern 310*a*, which is in contact with the lower bonding pad 113, the nickel pillar pattern 310*b*, which is placed on the first copper pillar pattern 310*a*, and the second copper pillar pattern 310*c*, which is placed on the nickel pillar pattern 310*b*. The solder portion 330 may be bonded to the bottom surface of the pillar portion 310 and may be in contact with the second copper pillar pattern 310*c*. The solder portion 330 may include the solder layer 330*a*, the metal layer ML, and the high-melting-point metal atoms HM. The high-melting-point metal atoms HM may include at least one of, for example, titanium (Ti) and/or copper (Cu) atoms. The solder portion 330 may be composed of an intermetallic compound (IMC), which includes the high-melting-point metal atoms HM and tin (Sn) atoms. A concentration of the high-melting-point metal atoms HM in the solder portion 330 may decrease as a distance to the pillar portion 310 decreases. The metal layer ML may be removed in the fabrication process of the semiconductor package 2000.

The second substrate 200 may include upper conductive pads 211 and lower conductive pads 213, which are respectively provided on top and bottom surfaces of the second substrate. The upper conductive pads 211 may be electrically connected to the bumps 300. The second substrate 200 may include a plurality of internal lines 220. The internal lines 220 may be provided to electrically connect the upper conductive pads 211 to corresponding ones of the lower conductive pads 213. Outer connection members 360 may be bonded to the lower conductive pads 213 of the second substrate 200. The high-melting-point metal atom HM may be absent in the outer connection members 360.

The mold layer 500 may be provided to cover the first substrate 100, the first semiconductor chip CH1, and the second semiconductor chip CH2. The mold layer 500 may be formed of or include an insulating resin (e.g., an epoxy molding compound (EMC)). The mold layer 500 may further include fillers, which are dispersed in an insulating resin. In an embodiment of the present inventive concept, the filler may be formed of or include silicon oxide ($SiO_2$).

The first substrate 100, the first semiconductor chip CH1, and the second semiconductor chip CH2 may be the same as or similar to those in the semiconductor package 1000 described with reference to FIGS. 1A to 3.

Figure 5:
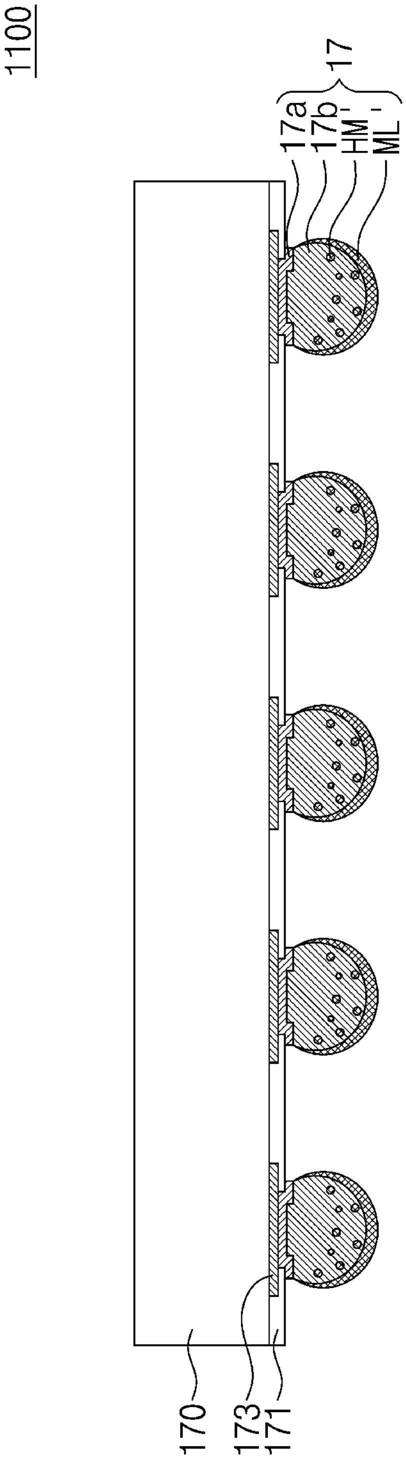
FIG. 5 is a sectional view illustrating a semiconductor package according to an embodiment of the present inventive concept.

FIG. 5 is a sectional view illustrating a semiconductor package according to an embodiment of the present inventive concept.

Referring to FIG. 5, a semiconductor package 1100 may be provided. The semiconductor package 1100 may include a semiconductor substrate 170, bonding pads 173, and bump structures 17. The semiconductor substrate 170 may be formed of or include a semiconductor material (e.g., silicon, germanium, or silicon germanium). The semiconductor substrate 170 may further include a circuit pattern, internal lines, and an insulating layer. The bonding pads 173 may be disposed on a bottom surface of the semiconductor substrate 170. The bonding pads 173 may be formed of or include at least one of metallic materials (e.g., aluminum or copper). A passivation layer 171 may be formed to cover the bonding pads 173 and the bottom surface of the semiconductor substrate 170. For example, the passivation layer 171 may be directly disposed on the bonding pads 173 and the bottom surface of the semiconductor substrate 170. The passivation layer 171 may be formed of or include an insulating material. The bump structures 17 may be connected to the bonding pads 173. For example, the bump structures 17 may be formed to be in contact with the bonding pads 173.

The bump structures 17 may include an under bump metallurgy (UBM) pattern 17*a*, a bump solder layer 17*b*, a high-melting-point metal atoms HM', and a metal layer ML'. For example, the high-melting-point metal atoms HM' may include at least one of titanium (Ti) and/or copper (Cu) atoms. The bump solder layer 17*b* may be composed of an intermetallic compound (IMC), which includes the high-melting-point metal atoms HM' and tin (Sn) atoms. An intermetallic compound (IMC) may be formed between the bump solder layer 17*b* and the metal layer ML' by heat that is generated during a reflow process. The presence of the intermetallic compound (IMC) may increase the strength of the bump solder layer 17*b* and may prevent the physical damage of the bump structures 17. The bump solder layer 17*b* may include crystal grains, and the high-melting-point metal atoms HM' may be present in an interface between the crystal grains. A concentration of the high-melting-point metal atoms HM' in the bump solder layer 17*b* may decrease as a distance to the UBM pattern 17*a* decreases. The metal layer ML' of the semiconductor package 1100 may be the same as or similar to the metal layer ML described with reference to FIGS. 1A to 3. The metal layer ML' may be removed in the fabrication process of the semiconductor package 1100. Even when the structure of the bump structures 17 is changed as shown in FIG. 5, the metal layer ML and the method of forming the same may be applied to such a structure in the same or equivalent manner as described with reference to FIGS. 1A to 3, if the bump solder layer 17*b* includes tin (Sn).

According to an embodiment of the present inventive concept, in a semiconductor package, a metal layer including high-melting-point metal atoms may be deposited on a solder portion of a bump to form an intermetallic compound (IMC) and increase a strength of the solder portion. Accordingly, when the bump is exposed to the hot environment during a chip-on-wafer (CoW) reflow process, the metal layer and the intermetallic compound (IMC) may be used to protect the solder portion, and furthermore, it may be possible to prevent the solder portion from being physically damaged or deformed. In addition, since the damage of the solder portion is prevented, it may be possible to reduce a non-wetting issue between the solder portion and a package substrate in a process of bonding a semiconductor package of a molding-in-package (MIP) structure to the package substrate and consequently manufacture the semiconductor package with a high production yield. Thus, it may be possible to increase the endurance and reliability characteristics of the semiconductor package.

While the present inventive concept has been described with reference to example embodiments thereof, it will be understood by those of ordinary skill in the art that various changes in form and details may be made thereto without departing from the spirit and scope of the present inventive concept.

What is claimed is:

1. A semiconductor package, comprising:

a first substrate including an upper surface, a lower surface, and lower bonding pads;

at least one semiconductor chip disposed on the upper surface of the first substrate;

bumps disposed on the lower surface of the first substrate; and a mold layer disposed on the upper surface of the first substrate and covering the at least one semiconductor chip, wherein the bumps comprise:

a pillar portion bonded to the lower surface of the first substrate and a solder portion bonded to a lower surface of the pillar portion with respect to the lower surface of the first substrate, wherein the solder portion comprises a solder layer and a metal layer, wherein the metal layer comprises a material including high-melting-point metal atoms, wherein the metal layer covers a first lower surface of the solder layer with respect to the lower surface of the first substrate, and wherein the solder portion comprises the high-melting-point metal atoms.

2. The semiconductor package of claim 1, wherein the pillar portion comprises:

a first copper pillar pattern disposed on the lower bonding pad;

a nickel pillar pattern disposed on the first copper pillar pattern; and a second copper pillar pattern disposed on the nickel pillar pattern.

3. The semiconductor package of claim 1, wherein a concentration of the high-melting-point metal atoms in the solder portion decreases as a distance to the pillar portion decreases.

4. The semiconductor package of claim 1, wherein the solder portion comprises an intermetallic compound, which includes the high-melting-point metal atoms and tin (Sn) atoms.

5. The semiconductor package of claim 1, wherein the high-melting-point metal atoms include at least one of titanium (Ti) or copper (Cu) atoms.

6. The semiconductor package of claim 5, wherein a melting temperature of the high-melting-point metal atoms is higher than a melting temperature of tin (Sn).

7. The semiconductor package of claim 1, wherein the metal layer has a thickness ranging from about 1 nm to about 1 μm.

8. The semiconductor package of claim 1, wherein the solder portion further comprises crystal grains, wherein the high-melting-point metal atoms are present in an interface between the crystal grains.

9. The semiconductor package of claim 1, further comprising inner solder balls, which are provided between the first substrate and the at least one semiconductor chip to electrically connect the first substrate to the at least one semiconductor chip, wherein the high-melting-point metal atoms are absent from the inner solder balls.

10. The semiconductor package of claim 1, further comprising:

a second substrate disposed below the first substrate and electrically connected to the first substrate by the bumps; and outer solder balls disposed below the second substrate, wherein the high-melting-point metal atoms are absent from the outer solder balls.

11. A semiconductor package, comprising:

a first substrate including a top surface, a bottom surface, and lower bonding pads;

at least one semiconductor chip disposed on the top surface of the first substrate;

bumps bonded to the lower bonding pads on the bottom surface of the first substrate; and a mold layer disposed on the top surface of the first substrate and covering the at least one semiconductor chip, wherein the bumps comprise:

a pillar portion bonded to a bottom surface of the lower bonding pad with respect to the bottom surface of the first substrate, and a solder portion bonded to a bottom surface of the pillar portion with respect to the bottom surface of the first substrate, wherein the solder portion comprises a solder layer and a metal layer, wherein the metal layer covers a bottom surface of the solder layer with respect to the bottom surface of the first substrate, wherein the metal layer includes a material including high-melting-point metal atoms, wherein the pillar portion comprises:

a first copper pillar pattern disposed on the lower bonding pad;

a nickel pillar pattern disposed on the first copper pillar pattern; and a second copper pillar pattern disposed on the nickel pillar pattern, wherein the solder portion comprises:

crystal grains including tin atoms; and the high-melting-point metal atoms, which are present in an interface between the crystal grains, wherein the high-melting-point metal atoms comprise at least one of titanium (Ti) or copper (Cu) atoms, and a melting temperature of the high-melting-point metal atoms is higher than a melting temperature of tin (Sn).

12. The semiconductor package of claim 11, wherein a concentration of the high-melting-point metal atoms in the solder portion decreases as a distance to the pillar portion decreases.

13. The semiconductor package of claim 11, further comprising inner solder balls, which are provided between the first substrate and the at least one semiconductor chip to electrically connect the first substrate to the at least one semiconductor chip, wherein the high-melting-point metal atoms are absent from the inner solder balls.

14. The semiconductor package of claim 11, further comprising:

a second substrate disposed on the first substrate and electrically connected to the first substrate by the bumps; and outer solder balls disposed on the second substrate, wherein the high-melting-point metal atoms are absent from the outer solder balls.

15. The semiconductor package of claim 13, further comprising a penetration via penetrating the first substrate and electrically connecting the inner solder balls to the bumps.

16. A semiconductor package, comprising:

a package substrate including an upper surface and a lower surface;

an interposer substrate disposed on the upper surface of the package substrate, and comprising lower bonding pads;

at least one semiconductor chip disposed on an upper surface of the interposer substrate;

inner connection members connecting the interposer substrate to the at least one semiconductor chip;

bumps disposed on a lower surface of the interposer substrate; and a mold layer disposed on the upper surface of the interposer substrate and covering the at least one semiconductor chip, wherein the bumps comprise:

a pillar portion bonded to the interposer substrate, and a solder portion bonded to the pillar portion, wherein the solder portion comprises a solder layer and a metal layer, wherein the metal layer covers a bottom surface of the solder layer, wherein the metal layer comprises a material including high-melting-point metal atoms, wherein the pillar portion comprises:

a first copper pillar pattern in contact with the lower bonding pad;

a nickel pillar pattern disposed on the first copper pillar pattern; and a second copper pillar pattern disposed on the nickel pillar pattern, wherein the solder portion includes an intermetallic compound, which includes the high-melting-point metal atoms and tin atoms, and wherein a melting temperature of the high-melting-point metal atoms is higher than a melting temperature of tin (Sn).

17. The semiconductor package of claim 16, wherein the high-melting-point metal atoms are absent from the inner connection members.

18. The semiconductor package of claim 16, wherein the package substrate further comprises upper conductive pads on the upper surface thereof and lower conductive pads on the lower surface thereof, wherein the upper conductive pads are electrically connected to the bumps, wherein the semiconductor package further comprises outer connection members bonded to the lower conductive pads, and wherein the high-melting-point metal atoms are absent from the outer connection members.

19. The semiconductor package of claim 16, wherein a concentration of the high-melting-point metal atoms in the solder portion decreases as a distance to the pillar portion decreases.

20. The semiconductor package of claim 16, wherein the high-melting-point metal atoms include at least one of titanium (Ti) or copper (Cu) atoms.

* * * * *